United States Patent [19]

Nonaka

[11] Patent Number: 4,647,134
[45] Date of Patent: Mar. 3, 1987

[54] IC SOCKET CONTACT

[75] Inventor: Yoshimasa Nonaka, Tokyo, Japan

[73] Assignee: Augat Inc., Mansfield, Mass.

[21] Appl. No.: 688,646

[22] Filed: Jan. 4, 1985

[30] Foreign Application Priority Data

Feb. 9, 1984 [JP] Japan .............................. 59-16090[U]

[51] Int. Cl.$^4$ .......................................... H01R 13/629
[52] U.S. Cl. ............... 339/75 M; 339/258 R
[58] Field of Search ............. 339/74 R, 75 M, 258 R, 339/258 P

[56] References Cited

U.S. PATENT DOCUMENTS

| 3,538,486 | 11/1970 | Shlesinger, Jr. | 339/74 R |
| 3,543,217 | 11/1970 | Klumpp, Jr. | 339/258 R |
| 3,676,832 | 7/1972 | Judge et al. | 339/75 M |
| 4,232,931 | 11/1980 | Takeuciti et al. | 339/258 R |
| 4,498,725 | 2/1985 | Bright et al. | 339/75 M |

FOREIGN PATENT DOCUMENTS 1142196  1/1963  Fed. Rep. of Germany ... 339/258 R

Primary Examiner—John McQuade
Attorney, Agent, or Firm—Weingarten, Schurgin, Gagnebin & Hayes

[57] ABSTRACT

A specialized contact structure is provided for IC sockets to permit increases contact pressure and to permit contact with an IC lead at its base instead of at its tip. The socket includes a substrate with the subject contacts embedded therein in rows, an overlying lever-actuated plate having corresponding rows of apertures, with the apertures corresponding to IC lead positions. In operation, the IC leads are inserted into the apertures in the lever-actuated plate and the plate with the inserted leads is moved laterally, such that the leads are moved laterally into contact with the mating contact arms of the contacts mounted in the substrate. In order to provide reliable contact with the base of the lead, each contact has a leg portion extending outwardly from the substrate, with the contact being formed from contact arms in the form of a pair of opposing rectangular tongue pieces integrally formed with the leg portion, and abutment portions formed by inwardly bending the tips of the tongue pieces by an angle more than 90 degrees so that the tips of the contact arms come into contact with each other to form a spring-loaded contact adjacent the top of the tongue pieces. The sides of the spring-loaded contact into which an IC lead is to be laterally moved has a "V"-shaped face to guide the IC lead in between the contact arms, with a laterally-running top edge bevel being provided on each of the mating inwardly-bent contact arms.

4 Claims, 6 Drawing Figures 4,647,134

IC SOCKET CONTACT

FIELD OF INVENTION

The present invention relates to improvements in contacts of an IC socket having a no-load detachable mechanism.

BACKGROUND OF INVENTION

Since a conventional integrated circuit (IC) socket having a no-load detachable mechanism has a less danger of lead damage or bending, e.g., having a zero insertion force (ZIF) feature, when an IC is connected to and disconnected from the IC socket, the integrated circuit can be easily connected to and disconnected from the IC socket. As a result, the conventional no-load IC socket has been used in the field of the associated equipment highly satisfactorily. This type of IC socket, however, has the defect that the IC socket often provided poor contact to the IC leads because connection and disconnection between the IC leads and associated contacts are carried out structurally within a very small distance.

SUMMARY OF THE INVENTION

The present invention provides an IC socket which removes the above defect and which enables the highly smooth mounting and removal of an IC on and from the IC socket without causing poor contact even for frequent mounting and removing operations.

The present IC socket having a no-load detachable mechanism, comprises a substrate having a plurality of contact embedding holes arranged in a row which correspond in number to the number of IC leads, a laterally moveable plate mounted on the substrate which slides laterally over the embedding holes through the operation of a handle provided at a portion of the substrate. The moveable plate is formed with a plurality of insert holes at positions corresponding to the embedding holes, and a plurality of contacts are mounted within the contact embedding holes. Each contact has a leg portion extending outwardly from the substrate, a pair of opposing rectangular tongue pieces integrally formed with said leg portion, and abutment portions formed by bending inwardly tip ends of the tongue pieces by an angle more than 90 degrees so that said tip ends come into contact with each other. The side ends of the abutment portions are respectively formed with a sloped angle and a bevel angle so that said side ends come into smooth contact with a corresponding one of said IC leads. In other words, the sloped angle is formed by a vertically running "V"-shaped face, whereas the top portion of the "V"-shaped face has horizontally running bevels.

BRIEF DESCRIPTION OF THE DRAWINGS

These and other features of the present invention will be better understood in connection with the Detailed Description taken in conjunction with the drawings of which.

DETAILED DESCRIPTION

Figure 1:
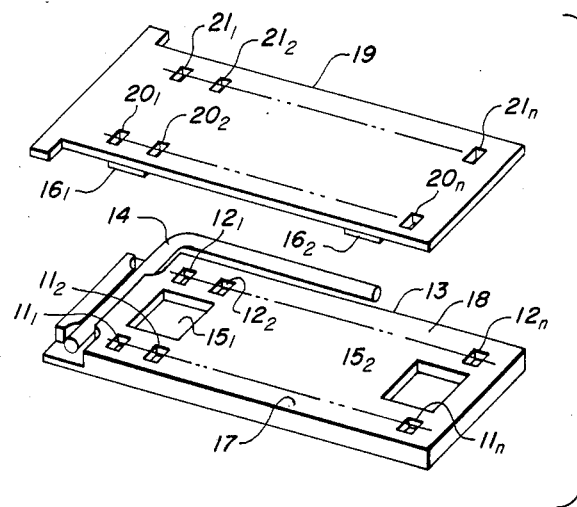
FIG. 1 is a diagrammatic view of the substrate and moveable plate of the subject invention.
Figure 2:
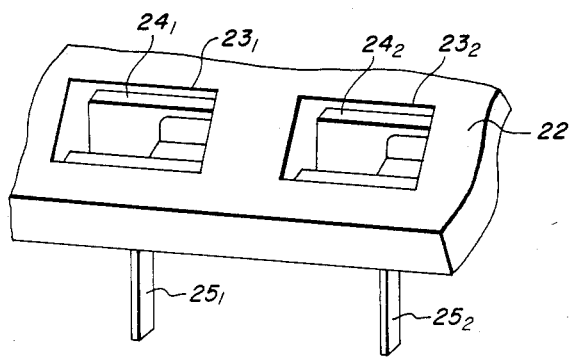
FIG. 2 is a diagrammatic illustration of a portion of the contacts for use in the apparatus of FIG. 1.

The present invention will be explained with reference to the drawings. There is shown in FIG. 1 an IC socket which comprises a plastic substrate 13 formed therein with rows of contact embedding holes $11_1$, $11_2$ ... $11_n$ and $12_1$, $12_2$ ... $12_n$ corresponding in number to IC leads, a moveable plate 19 having projections $16_1$ and $16_2$ to be inserted into a pair of through-holes $15_1$ and $15_2$ made in the substrate 13 when engagedly mounted on the substrate, said plate being slidable on the substrate along array lines 17 and 18 of the embedding holes $11_1$, $11_2$ ... $11_n$ and $12_1$, $12_2$ ... $12_n$ through the turning operation of a handle 14 rotatable provided at a portion of the substrate, said moveable plate being provided with a plurality of insert holes $20_1$, $20_2$ ... $20_n$ and $21_1$, $21_2$ ... $21_n$ at positions corresponding to the contact embedding holes $11_1$, $11_2$ ... $11_n$ and $12_1$, $12_2$ ... $12_n$ in alignment with the array lines, and a plurality of contacts (not shown in this figure) mounted within the contact embedding holes $11_1$, $11_2$ ... $11_n$ and $12_1$, $12_2$ ... $12_n$. Such contacts $24_1$, $24_2$ ..., as shown as partly enlarged in FIG. 2, are mounted within respective holes $23_1$, $23_2$ ... arranged in a row on a substrate 22 which is an enlarged portion of substrate 13, and comprise respective leg portions $25_1$, $25_2$ ... extending outwardly from the substrate 22.

Figure 3A:
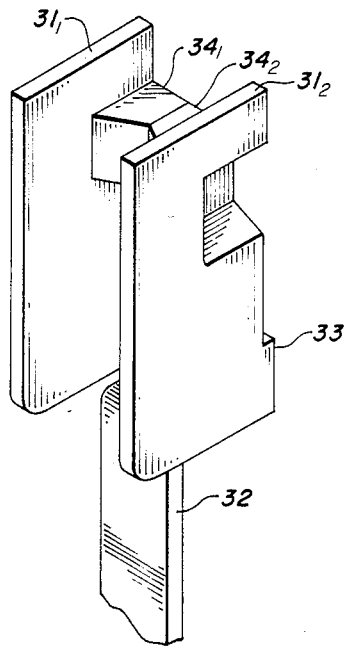
FIG. 3A and FIG. 3B are respectively diagrammatic and top illustrations of prior art contact showing lateral movement of a lead into the contact.
Figure 3B:
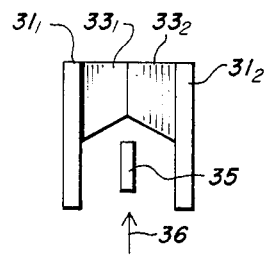

A prior art contact 33, as shown in FIG. 3, is made by punching a resilient metallic plate and comprises opposing rectangular tongue piece $31_1$ and $31_2$ and leg portion 32.

The tongue pieces $31_1$ and $31_2$ are formed at their upper portions with inwardly directed portions $34_1$ and $34_2$ raised by a pressing process, and the raised portions are positioned so that the faces of the raised portions come into contact with each other.

With such a contact 33, an IC lead 35 is moved in the direction illustrated by arrow 36 by a movement of the moveable plate forcing the lead into the gap between the opposing raised portions $34_1$ and $34_2$ such that contact is established with the lead.

During movement of the IC lead, however, the contact pressure of the raised portion often causes the deformation of the lead, resulting in a poor contact between the IC lead and raised portions. The major reason is due to the fact that it is difficult to provide the raised portions $34_1$ and $34_2$ at or close to the tops of the rectangular tongue pieces $31_1$ and $32_2$ from the viewpoint of its manufacturing technique and thus the raised portions are provided nearly in the middle of the tongue pieces.

Thus, the IC lead does not come into contact with the contact at the base portion of the IC lead, but rather it is the tip of the lead which comes into contact with the raised portions of the contact, whereby a slight deformaton of the lead often causes the shift of the contact position, applying an unnecessary force to the lead and causing the poor contact. In addition, due to contact area considerations, the contact disadvantageously cannot provide the sufficient and positive contact pressure.

Figure 4A:
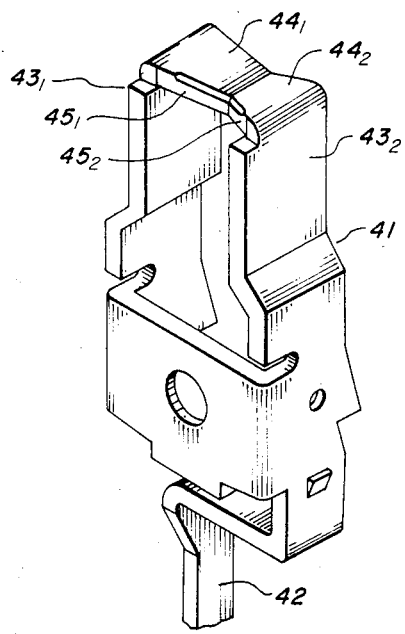
FIG. 4A and FIG. 4B are respectively diagrammatic and top views of the subject contact.
Figure 4:
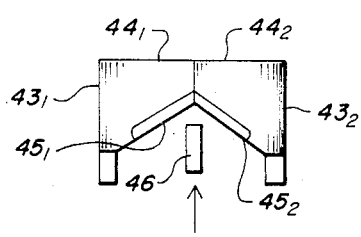

On the other hand according to the present invention, a contact 41, as shown in FIG. 4, is provided which includes a leg portion 42 extending outwardly from the substrate, a pair of opposing rectangular tongue pieces $43_1$ and $43_2$ provided integrally with the leg portion, and abutment portions $44_1$ and $44_2$ formed by bending inwardly the tip end portions of the tongues by an angle more than 90 degrees and preferably in the range of 100 to 140 degrees so that the tip end portions come into contact with each other close to the top of the contact; and side ends $45_1$ and $45_2$ of the abutment portions $44_1$ and $44_2$ are respectively formed with a sloped angle and a bevel angle so that the side ends come into smooth contact with an IC lead 46.

With the contact of such a structure, since the IC lead meets the contact at its base portion, lead deformation will not be caused and the abutment portions $44_1$ and $44_2$ hold the lead at their tip ends in a linear contact relation therebetween, whereby the contact pressure per unit area can be increased and thus the contact advantageously can secure the sufficient contact by a highly smooth operation.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. An integrated circuit socket and contact system for use with an integrated circuit having a predetermined number of leads, each having a width greater than its thickness, with the width running in a predetermined direction comprising:

a substrate having rows of contact embedding holes therein, the number of said contact embedding holes corresponding in number to the number of integrated circuit leads, said substrate also having a pair of through holes;

a moveable plate having projections to be inerted into said pair of through holes in said substrate, said plate being slideable on said substrate in the direction of the rows of contact embedding holes, said moveable plate being provided with a plurality of insert holes at positions corresponding to said contact embedding holes;

a handle operably attached to said substrate and said moveable plate to move said plate in the direction of said contact embedding holes; and contacts mounted within each contact embedding hole, each of said contacts including a leg portion extending outwardly from said substrate, a pair of opposed flat tongue pieces provided with said leg portion, said tongue pieces being bent inwardly at tip end portions thereof by an angle more than 90° such that the ends of the tongue pieces come into contact with each other adjacent the top of the contact to form a two-part abutment portion of the contact having a vertical "V"-shaped entry face, with the top portion of the "V"-shaped face including horizontal bevels such that smooth contact is made with an inserted integrated circuit lead moved laterally towards said "V"-shaped face by movement of said moveable plate upon insertion of the leads of said integrated circuit in said insert holes of said moveable plate.

2. The system of claim 1 wherein the tip end portion of each of said tongue pieces forming said abutment portions meet at an angle in the range of 100°–140°.

3. The system of claim 1 wherein the inwardly bent tip end portions of said tongue pieces are adjusted such that the portion of an inserted lead contacted by the two-part abutment portion is close to the base of the lead as it extends from its associated integrated circuit package, thereby to increase reliability of the contact and to prevent lead bending during the contacting process.

4. The system of claim 1 wherein each contact is unitary and is made by stamping out a predetermined form having a leg with a thick portion, bending the stamping such that said tongue pieces are parallel one to the other in spaced adjacency, and bending the tip end portions of the tongue pieces inwardly, said bending operations resulting in a contact in which said tongue pieces lie in planes parallel to that of the thick portion of said contact leg, and such that the abutment of the abutment portion is parallel to the aforesaid plane of said tongue pieces, said "V"-shaped face in general defining planes having a bisector which is parallel to the planes of said tongue pieces, and wherein said horizontal bevels are to the entry face side of the abutment portions such that the entry face receives and directs the correspondingly laterally moved lead into position between the tip end portions with minimized bending of the lead.

* * * * *